United States Patent
Mäki

(10) Patent No.: US 11,197,070 B2
(45) Date of Patent: Dec. 7, 2021

(54) ARRANGEMENT FOR CATV AMPLIFIER CONTROL

(71) Applicant: Teleste Oyj, Littoinen (FI)

(72) Inventor: Kari Mäki, Turku (FI)

(73) Assignee: Teleste OYJ, Littoinen (FI)

(*) Notice: Subject to any disclaimer, the term of this patent is extended or adjusted under 35 U.S.C. 154(b) by 0 days.

(21) Appl. No.: 17/253,321

(22) PCT Filed: Jun. 27, 2018

(86) PCT No.: PCT/FI2018/050508
§ 371 (c)(1),
(2) Date: Dec. 17, 2020

(87) PCT Pub. No.: WO2020/002747
PCT Pub. Date: Jan. 2, 2020

(65) Prior Publication Data
US 2021/0266643 A1 Aug. 26, 2021

(51) Int. Cl.
*H04N 7/16* (2011.01)
*H04N 21/61* (2011.01)
*H04N 21/238* (2011.01)

(52) U.S. Cl.
CPC ......... *H04N 21/615* (2013.01); *H04N 21/238* (2013.01)

(58) Field of Classification Search
CPC .............................. H04N 21/615; H04N 21/238
See application file for complete search history.

(56) References Cited

U.S. PATENT DOCUMENTS

| 10,785,048 B2* | 9/2020 | Ulm ................... H04L 12/2801 |
| 2014/0010555 A1 | 1/2014 | Travis et al. |
| 2015/0049822 A1 | 2/2015 | Schemmann et al. |
| 2015/0162882 A1* | 6/2015 | Tam ....................... H03F 1/3282 330/291 |
| 2015/0304064 A1 | 10/2015 | Mutalik et al. |

(Continued)

FOREIGN PATENT DOCUMENTS

EP 1936977 A2 6/2008

OTHER PUBLICATIONS

Maxwell Huang et.al. 'Power amplifier bias adjustment in field for 1-10 HFC node and amplifier'. In: IP.com Prior Art Database, IP.com [online], Jan. 27, 2016, technical disclosure No. IPCOM000244896D, ISSN 1533-0001, <https://priorart.ip.com/IPCOM/000244896>, XP 013170501 [retrieved on Feb. 18, 2019] pp. 1-5, especially abstract; p. 3 line 1 0-p. 4, line 6.

*Primary Examiner* — Mulugeta Mengesha
(74) *Attorney, Agent, or Firm* — Mueting Raasch Group

(57) ABSTRACT

A network element of a cable television (CATV) network, said network element comprising one or more amplifier units for amplifying downstream signal transmission for digital output into one or more output channels; means for detecting output power of all active digital output channels; means for providing a predetermined correlation between the detected output power of said active digital output channels and a corresponding minimum bias current for said one or more amplifier units; and means for adjusting the bias current of said one or more amplifier units on the basis of the predetermined correlation.

8 Claims, 2 Drawing Sheets

(56) References Cited

U.S. PATENT DOCUMENTS

| | | | |
|---|---|---|---|
| 2016/0072530 A1* | 3/2016 | El-Hassan | H03F 3/24 |
| | | | 455/114.2 |
| 2018/0109319 A1 | 4/2018 | Michael et al. | |
| 2018/0124716 A1* | 5/2018 | Krishnan | H03F 3/19 |

* cited by examiner

ARRANGEMENT FOR CATV AMPLIFIER CONTROL

PRIORITY

This application is a U.S. national application of the international application number PCT/FI2018/050508 filed on Jun. 27, 2018, the contents of which are incorporated herein by reference.

FIELD OF THE INVENTION

The invention relates to cable television (CATV) networks, and especially to controlling CATV amplifiers.

BACKGROUND OF THE INVENTION

CATV networks may be implemented with various techniques and network topologies, but currently most cable television networks are implemented as so-called HFC networks (Hybrid Fiber Coax), i.e. as combinations of a fiber network and a coaxial cable network. FIG. 1 shows the general structure of a typical HFC network. Program services are introduced from the main amplifier 100 (a so-called headend) of the network via an optical fiber network 102 to an optical node 104, which converts the optical signal to an electric signal to be relayed further in a coaxial cable network 106. Depending on the length, branching, topology, etc. of the coaxial cable network, this coaxial cable segment typically comprises one or more broadband amplifiers 108, 110 for amplifying program service signals in a heavily attenuating coaxial media. From the amplifier the program service signals are introduced to a cable network 112 of a smaller area, such as a distribution network of an apartment building, which are typically implemented as coaxial tree or star networks comprising signal splitters for distributing the program service signals to each customer. From a wall outlet the signal is further relayed either via a cable modem 114 to a television receiver 116 or a computer 118, or via a so-called set-top box 120 to a television receiver 122.

Both the optical nodes and amplifiers along the downstream path comprise a plurality of amplifier units/stages for amplifying the downstream signals. The parameters of the components in the amplifier stages within the network elements need to be dimensioned such they can handle the worst-case situation of the whole frequency area being loaded with active channels at maximum output level. On the other hand, in typical real-life use-cases there are a number of unallocated channels in the network and/or the output signal level is not even close to maximum. This would allow running the amplifiers with smaller bias current and thus lowering the power consumption of the device.

There are some traditional analogue amplifiers provided with automatic bias current control, where the output power after the last amplifier stage is measured and tuning the bias current is controlled based on the measured output power. However, the mere output power of analogue signals is rather inaccurate in a sense that it provides very little information about the underlying channel configuration. In practice, for adjusting the bias current of an amplifier in analogue channels, the exact channel raster needs to be known.

BRIEF SUMMARY OF THE INVENTION

Now, an improved arrangement has been developed to reduce the above-mentioned problems. As aspects of the invention, we present a network element of a cable television network, which is characterized in what will be presented in the independent claims.

The dependent claims disclose advantageous embodiments of the invention.

According to an aspect of the invention, there is provided a network element of a cable television (CATV) network, said network element comprising one or more amplifier units for amplifying downstream signal transmission for digital output into one or more output channels; means for detecting output power of all active digital output channels; means for providing a predetermined correlation between the detected output power of said active digital output channels and a corresponding minimum bias current for said one or more amplifier units; and means for adjusting the bias current of said one or more amplifier units on the basis of the predetermined correlation.

According to an embodiment, said predetermined correlation comprises at least a first network element-specific correlation equation between the detected output power of said active digital output channels and the corresponding minimum bias current, wherein the first correlation equation is measured using an output signal characterised by first signal quality criteria.

According to an embodiment, said predetermined correlation comprises at least a second network element-specific correlation equation between the detected output power of said active digital output channels and the corresponding minimum bias current, wherein the second correlation equation is measured using an output signal characterised by second lower signal quality criteria.

According to an embodiment, the signal quality criteria are defined in terms of maximum allowable values of bit error rate (BER) and/or modulation error ratio (MER).

According to an embodiment, said correlation curves are defined for output power between a range of at least 5-25 dBm.

According to an embodiment, said means for detecting output power of all active digital output channels comprises a broadband RF detector.

According to an embodiment, the digital output channels are modulated according to Single-Carrier Quadrature Amplitude Modulation (SC-QAM) or Orthogonal Frequency-Division Multiplexing (OFDM).

According to an embodiment, said amplifier units comprise one or more of the following: a mid-stage amplifier unit, a gain control amplifier unit, a slope control amplifier unit, an output hybrid amplifier unit.

According to an embodiment, the bias current of said one or more amplifier units is configured to be adjusted on the basis of detected changes in the output power of said active digital output channels.

According to an embodiment, the downstream signal transmission further comprises one or more analog signals to be amplified to one or more analog output channels.

These and other aspects, embodiments and advantages will be presented later in the detailed description of the invention.

BRIEF DESCRIPTION OF THE DRAWINGS

The invention will now be described in more detail in connection with preferred embodiments with reference to the appended drawings, in which.

DETAILED DESCRIPTION OF THE EMBODIMENTS

Data Over Cable Service Interface Specification (DOCSIS) is a CATV standard providing specifications for high-bandwidth data transfer in an existing CATV system. DOCSIS may be employed to provide Internet access over existing hybrid fiber-coaxial (HFC) infrastructure of cable television operators. DOCSIS has been evolved through versions 1.0, 1.1, 2.0 and 3.0 to the latest version of 3.1. DOCSIS provides a lucrative option for cable network providers to maximize both the downstream and upstream data throughput using the existing cable TV network, but without making expensive changes to the HFC network infrastructure.

Figure 1:
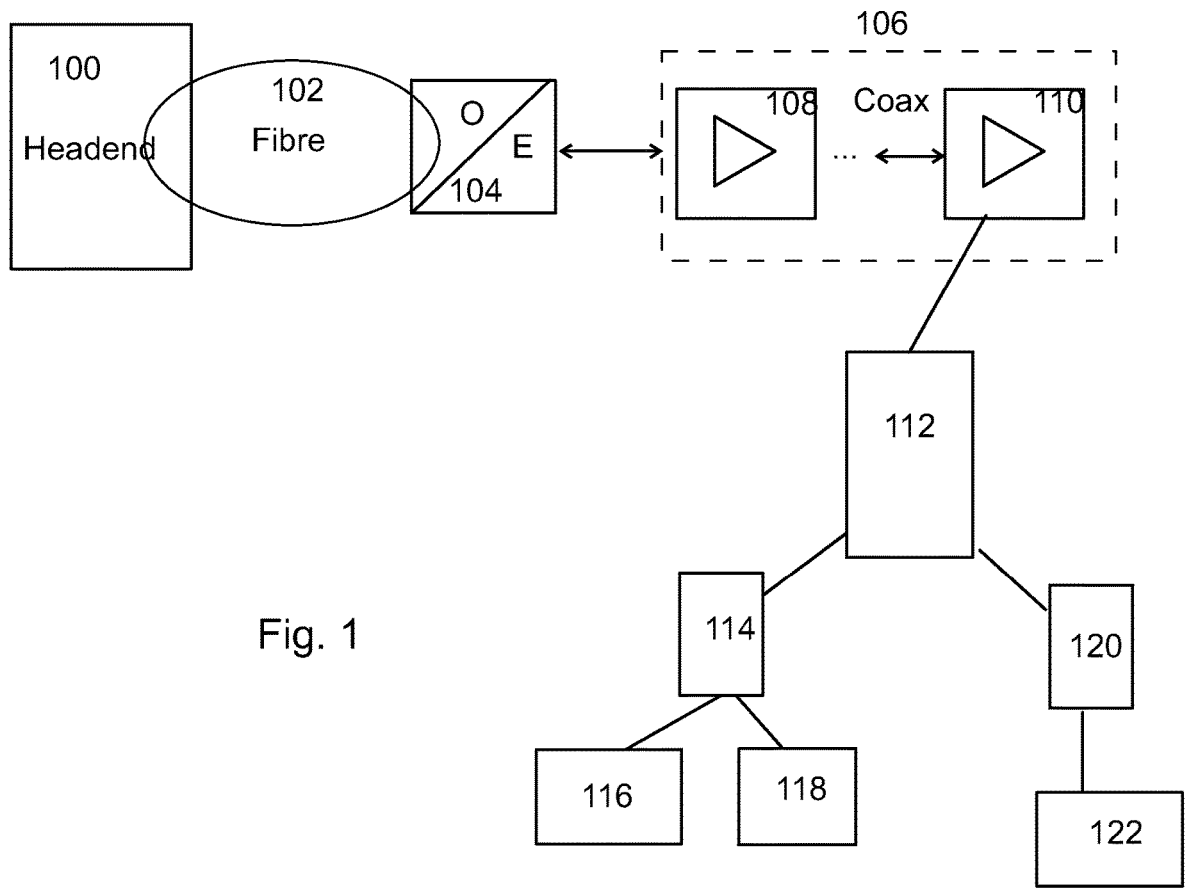
FIG. 1 shows the general structure of a typical HFC network.

When implementing the HFC network of FIG. 1 according to DOCSIS, the headend 100 of the CATV network comprises inputs for signals, such as TV signals and IP signals, a television signal modulator and a cable modem termination system (CMTS). The CMTS provides high-speed data services to customers thorough cable modems (CM; 114) locating in homes. The CMTS forms the interface to the IP-based network over the Internet. It modulates the data from the Internet for downstream transmission to homes and receives the upstream data from homes. The CMTS additionally manages the load balancing, error correction parameters and the class of service (CoS).

Signals from the headend 100 are distributed optically (fiber network 102) to the vicinity of individual homes, where the optical signals are converted to electrical signals at the terminating points 104. The electrical signals are then distributed to the various homes via the existing 75 ohm coaxial cables 106. The maximum data transfer of the coaxial cables is limited due to strong frequency-based attenuation. Therefore, the electrical signals transmitted over coaxial cables must be amplified. The amplifiers 108, 110 used for this purpose are suited to a specific frequency range. In addition, the upstream and downstream must occur over the same physical connection. The last part 112 of the coaxial connection between the CMTS and the CMs branches off in a star or a tree structure. A CMTS transmits the same data to all CMs located along the same section of cable (one-to-many communications). A request/grant mechanism exists between the CMTS and the CMs, meaning that a CM needing to transmit data must first send a request to the CMTS, after which it can transmit at the time assigned to it.

Depending on the version of DOCSIS used in the CATV network, there is a great variety in options available for configuring the network. For the downstream channel width, all versions of DOCSIS earlier than 3.1 use either 6 MHz channels (e.g. North America) or 8 MHz channels (so-called "EuroDOCSIS"). However, the upstream channel width may vary between 200 kHz and 3.2 MHz (versions 1.0/1.1), and even to 6.4 MHz (version 2.0). 64-QAM or 256-QAM modulation is used for downstream data in all versions, but upstream data uses QPSK or 16-level QAM (16-QAM) for DOCSIS 1.x, while QPSK, 8-QAM, 16-QAM, 32-QAM, 64-QAM and 128-QAM are used for DOCSIS 2.0 & 3.0.

DOCSIS 3.1 specifications support capacities of at least 10 Gbit/s downstream and 1 Gbit/s upstream using 4096 QAM. DOCSIS 3.1 rejects the 6 or 8 MHz wide channel spacing and uses narrower orthogonal frequency-division multiplexing (OFDM) subcarriers being 20 kHz to 50 kHz wide, which sub-carriers can be combined within a block spectrum of about 200 MHz wide.

DOCSIS 3.1 further provides the concept of Distributed CCAP Architecture (DCA). Converged Cable Access Platform (CCAP) may be defined as an access-side networking element or set of elements that combines the functionality of a CMTS with that of an Edge QAM (i.e. the modulation), providing high-density services to cable subscribers. Conventionally, the CCAP functionalities have been implemented in the headend/hub, such as the headend 100 in FIG. 1. In a DCA, some features of the CCAP are distributed from headend/hub to the network elements closer to the customers, for example to the optical nodes 104 in FIG. 1. DOCSIS 3.1 specifies at least two network element concepts, i.e. a Remote PHY Device (RPD) and a Remote-MACPHY Device (RMD), to which some functionalities of the headend can be distributed. A recent version of DOCSIS 3.1 specification also provided Annex F introducing a Full Duplex DOCSIS 3.1 technology, where a new distributed access node called Full Duplex (FDX) Node is determined.

The data transmission between the distributed parts of the CCAP is typically carried out through a fiber connection. This may provide both scale advantages and flexible deployment options by maximizing the channel capacity and simplifying many operations via the usage of digital fiber and Ethernet transport.

The amplifiers and optical nodes in a HFC network (e.g. 104, 108, 110 in FIG. 1) are specified for some frequency range, today typically up to 1.2 GHz. The parameters of the components in the amplifier stages within the devices need to be dimensioned such they can handle the worst-case situation of the whole frequency area being loaded with active channels at maximum output level. On the other hand, in typical real-life use-cases there are a number of unallocated channels in the network and/or the output signal level is not even close to maximum. This would allow running the amplifiers with smaller bias current and thus lowering the power consumption of the device.

In some existing optical node and amplifier products, there is a setting to lower the bias current for the output hybrid (i.e. the last amplifier stage before the output). This setting needs to be manually set in the user interface of the device. There are also traditional analogue devices with automatic bias current control, where the output power after the last amplifier stage is measured and tuning the bias current is controlled based on the measured output power. However, the mere output power of analogue signals is rather inaccurate in a sense that it provides very little information about the underlying channel configuration. In practice, for adjusting the bias current of an amplifier in analogue channels, the exact channel raster needs to be known.

Consequently, an improved arrangement is presented herein for adjusting the bias current of amplifier units in network elements.

According to an aspect, a network element of a cable television (CATV) network is now introduced, said network element comprising one or more amplifier units for amplifying downstream signal transmission for digital output into one or more output channels; means for detecting output power of all active digital output channels; means for providing a predetermined correlation between the detected output power of said active digital output channels and a corresponding minimum bias current for said one or more amplifier units; and means for adjusting the bias current of said one or more amplifier units on the basis of the predetermined correlation.

Hence, fully digital or almost fully digital network load of the contemporary CATV networks enable to use the detected output power of all active digital output channels for adjusting the bias current of the amplifier. For this purpose, the network element comprises a predetermined correlation, for example stored in a memory of the network element, where a correspondence of the detected output power of said active digital output channels with a matching minimum bias current for said one or more amplifier units can be checked. The correlation may be measured and determined, for example upon manufacturing the network element, but preferably at least before installing the network element into the CATV network. Thus, upon detecting a certain level of output power, the value for the bias current may be checked from said predetermined correlation, and the bias current is adjusted accordingly.

It is noted that in many countries, the cable operators supply the CATV transmission with RF overlay signals, which may comprise analog TV signals, satellite TV signals, locally generated content, etc. Consequently, the downstream signal transmission may further comprise one or more analog signals to be amplified to one or more analog output channels. Thus, the network load may be only almost fully digital, but the share of the analog channels from the whole transmission bandwidth is typically rather minor. Therefore, the impact of the analog channels to the output power may be neglectable.

According to an embodiment, said predetermined correlation comprises at least a first network element-specific correlation equation between the detected output power of said active digital output channels and the corresponding minimum bias current, wherein the first correlation equation is measured using an output signal characterised by first signal quality criteria.

Thus, the network element may be tested with different values of output power and different values of bias current and find their correspondence in the first equation such that the signal quality always reaches an acceptable level according to the first signal quality criteria. As a result, the correlation is preferably defined according to the first signal quality criteria such that certain acceptable signal quality level is always reached irrespective of the total amount of RF output load.

The correlation equation may be stored in any usable in the memory of the network element. The correlation equation may be stored, for example, as a look-up table or a curve such that the correspondence of the detected output power with a matching bias current for said one or more amplifier units can be easily determined.

According to an embodiment, said predetermined correlation comprises at least a second network element-specific correlation equation between the detected output power of said active digital output channels and the corresponding minimum bias current, wherein the second correlation equation is measured using an output signal characterised by second lower signal quality criteria.

Hence, similar testing and measurements as with the first signal quality criteria may be performed for the second signal quality criteria. The second signal quality criteria may indicate a lower signal quality than the first signal quality. As a result, the network element comprises two correlation equations for different signal qualities, and the operating personnel may choose between the correlation equations. In a typical situation, if the lower signal quality is considered sufficient, then also a lower level bias current may advantageously be used.

It is noted that in addition to the first and second correlation equations, there may be any number of subsequent correlation equations having a signal quality of either lower or higher than the signal quality underlying the first and/or the second correlation equation.

According to an embodiment, the signal quality criteria are defined in terms of maximum allowable values of bit error rate (BER) and/or modulation error ratio (MER).

The bit error ratio (BER) may be defined as the number of bit errors divided by the total number of transferred bits during a studied time interval. Thus, the smaller the value of BER, the better is the signal quality.

Modulation error ratio (MER) indicates the deviations of the actual constellation points from the ideal locations caused e.g. by implementation imperfections or signal path. The modulation error ratio is equal to the ratio of the root mean square (RMS) power (in Watts) of the reference vector to the power (in Watts) of the error. It is defined in dB as: MER (dB)=10 $\log_{10}$ ($P_{error}/P_{signal}$) where $P_{error}$ is the RMS power of the error vector, and $P_{signal}$ is the RMS power of ideal transmitted signal. Thus, the smaller the value of MER (dB), the better is the signal quality. Vice versa, when the signal quality decreases, the MER value starts to grow until it reaches a level, which may still be considered "good enough", i.e. still allowable.

For example, the first signal quality criteria may be defined as BER <1*10e-10 and MER <-44 dB. The second lower signal quality criteria may be defined, for example, as BER <1*10e-9 and MER <-42 dB. A skilled person appreciates that these BER and MER values are only mentioned as examples of appropriate values, and any other values that may be regarded as acceptable signal quality level may be used instead.

Figure 2:
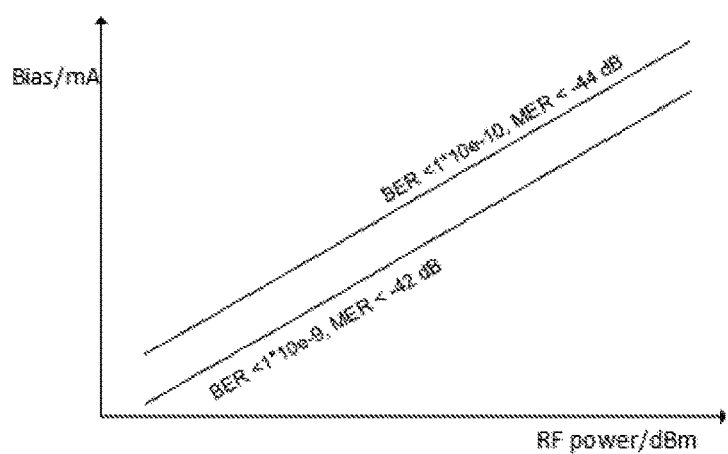
FIG. 2 shows a chart comprising examples of correlation curves based on correlation equations between the detected output power and the corresponding minimum bias current according to an embodiment of the invention.

These embodiments are illustrated in FIG. 2, where two examples of correlation curves are drawn based on correlation equations between the detected output power and the corresponding minimum bias current. The upper correlation curve represents the higher signal quality criteria, such as BER <1*10e-10 and MER <-44 dB. The lower correlation curve represents the lower signal quality criteria, such as BER <1*10e-9 and MER <-42 dB. As can be seen in FIG. 2, the lower the RF output power is, the smaller is the bias current that may be used while still reaching an acceptable level of the signal quality. On the other hand, for the same RF output power, for reaching a better signal quality a higher bias current must typically be used.

According to an embodiment, said correlation curves are defined for output power between a range of at least 5-25 dBm, preferably up to 28 dBm. Thereby, a sufficient output power range of a typical CATV amplifier is covered such that the linearity of the correlation equations may be approximated.

For testing the network element with different output powers, the measurement may start with a high value of the output RF power and the value of the RF output power may be reduced for the next measurements. For reducing the RF output power for the measurement purposes, an adjustable attenuator may be placed before the last, i.e. the output, amplifier unit. Alternatively, the RF output power may be reduced by decreasing the amount of digitally modulated signals. The reduction of channels is preferably performed in several different ways for finding out the worst-case situations.

According to an embodiment, said means for detecting output power of all active digital output channels comprises a broadband RF detector. A rather simple RF detector with only a moderate dynamic range may be used, since at maximum only the RF power that corresponds the maximum bias current must be possible to be measured and below the maximum RF power, a dynamic range of 15-25 dB range under the maximum RF power is sufficient. The detector is preferably calibrated in the manufacturing stage of the network element for achieving an accurate measurement of the absolute RF power.

According to an embodiment, the digital output channels are modulated according to Single-Carrier Quadrature Amplitude Modulation (SC-QAM) or Orthogonal Frequency-Division Multiplexing (OFDM). Thus, the embodiments described herein are especially applicable to CATV system according to DVB-C and DOCSIS standards, such as DOCSIS 3.1. Naturally, the embodiments are applicable to any other digital modulation scheme, such as those possibly adopted in future DOCSIS standards.

Figure 3:
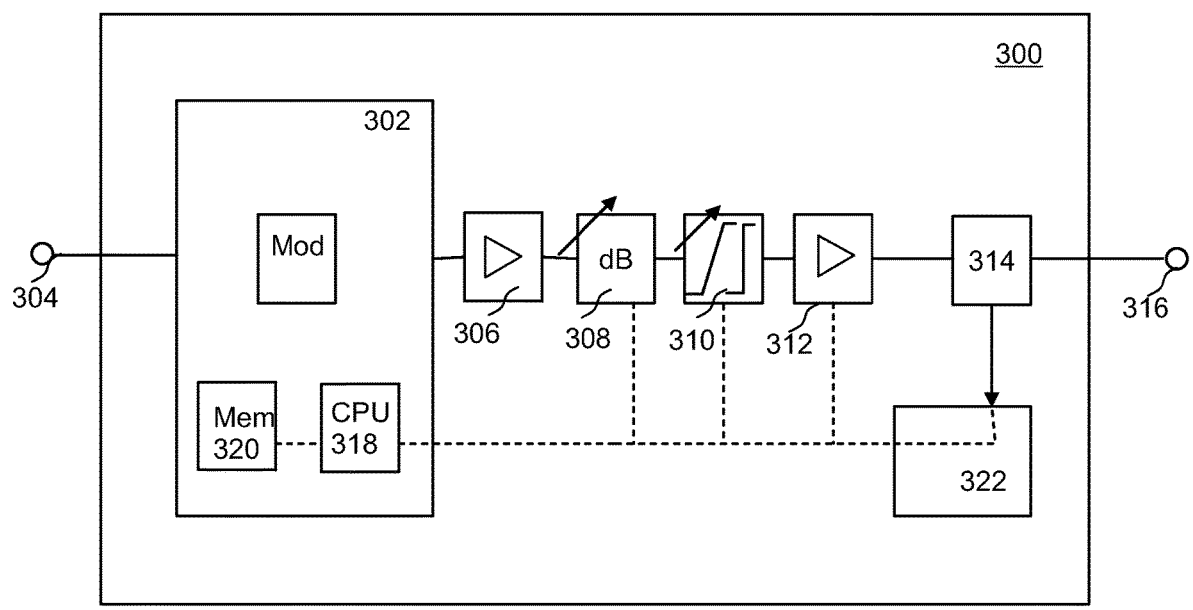
FIG. 3 shows a simplified block chart of a network element according to an embodiment of the invention.

FIG. 3 shows an example of a simplified block chart of network element according to an embodiment, the network element in this example being an optical node. FIG. 3 shows a simplification of the downstream path within the node; thus, no components relating to upstream path are shown. It is further noted that while FIG. 3 shows the implementation in a DCA device, such as an RPD/RMD node or an FDX node, the embodiments are equally applicable in any non-DCA node producing digital output signals.

The optical node 300 comprises a RPD/RMD module 302 arranged to receive digital downstream multiplexes from the headend via the optical interface 304. The RPD/RMD module 302 generates the RF output signals by modulating the digital signals accordingly. The network element typically comprises a plurality of amplifier units along the downstream path. There may be one or more mid-stage amplifier units 306, a gain control amplifier unit 308, a slope control amplifier unit 310 and the output hybrid amplifier unit 312. An RF detector 314 is arranged to detect RF output power of the active digital output channels, which is supplied further to a network segment via an output node 316.

The RPD/RMD module 302 may comprise a processing unit (CPU) 318 for controlling the operation of the RPD/RMD module 302 and at least some of components of the optical node. The processing unit 318 obtains the measurement of the total RF output power of the active digital output channels from the RF detector 314. The processing unit 318 obtains the one or more predetermined correlations from a memory 320, and checks the bias current corresponding to the detected output power. The processing unit 318 then supplies the bias current information to a bias control circuitry 322. Now, on the basis of the bias current information, the bias control circuitry 322 adjusts the bias current of one or more of these amplifier units such that a predetermined acceptable signal quality level of the active output channels is reached while at the same time, the power consumption is minimised. The number of amplifier units is not limited, but in practical implementations, the number of amplifier units whose bias current is adjusted is typically from one to four.

As mentioned above, the embodiments are equally applicable in any non-DCA node producing either digital or analogue output signals. For example, the embodiments may be applied in analogue nodes and broadband amplifiers. Therefore, according to an embodiment, the memory 320 comprising the one or more predetermined correlations may be in functional connection with the bias control circuitry 322 such that the bias control circuitry 322 directly obtains the correlations from the memory 320. Then the bias control circuitry 322 adjusts the bias current of one or more of these amplifier units on the basis of the bias current information obtained from the correlation. Thus, no separate processing unit is needed.

According to an embodiment, said means for detecting output power of all active digital output channels are configured to monitor changes in the RF output power; and the bias current of said one or more amplifier units is configured to be adjusted on the basis of detected changes in the information about the active output channels. Thus, if it is desirable that bias current is adjusted immediately upon changes in the configuration of the active output channels, the RF detector may be arranged to monitor the changes in the RF output power continuously and adjust the bias currents of the amplifier units on the basis of detected changes.

In the above embodiments, the network elements are provided with one or more predetermined correlations between the detected output power of said active digital output channels and the corresponding minimum bias current, the correlations being measured using an output signal characterised by predetermined signal quality criteria, for example in terms of BER and/or MER. Now the structure of the network elements may be simplified, since the BER and/or MER measurement capability is not needed anymore, but only a simple RF detection circuit is needed.

In general, the various embodiments may be implemented in hardware or special purpose circuits or any combination thereof. While various embodiments may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

A skilled person appreciates that any of the embodiments described above may be implemented as a combination with one or more of the other embodiments, unless there is explicitly or implicitly stated that certain embodiments are only alternatives to each other.

The various embodiments can be implemented with the help of computer program code that resides in a memory and causes the relevant apparatuses to carry out the invention. Thus, the implementation may include a computer readable storage medium stored with code thereon for use by an apparatus, such as the network element, which when executed by a processor, causes the apparatus to perform the various embodiments or a subset of them. Additionally or alternatively, the implementation may include a computer program embodied on a non-transitory computer readable medium, the computer program comprising instructions causing, when executed on at least one processor, at least one apparatus to apparatus to perform the various embodiments or a subset of them. For example, an apparatus may comprise circuitry and electronics for handling, receiving and transmitting data, computer program code in a memory, and a processor that, when running the computer program code, causes the apparatus to carry out the features of an embodiment.

It will be obvious for a person skilled in the art that with technological developments, the basic idea of the invention can be implemented in a variety of ways. Thus, the invention and its embodiments are not limited to the above-described examples but they may vary within the scope of the claims.

The invention claimed is:

1. A network element of a cable television (CATV) network, said network element comprising:
   one or more amplifier units configured to amplify downstream signal transmission for digital output into one or more output channels;
   a detector configured to detect total output power of all active digital output channels;
   a memory configured to store a predetermined correlation as a first network element-specific correlation equation between the detected output power of said active digital output channels and a corresponding minimum bias current for said one or more amplifier units, wherein the first correlation equation is defined using an output signal characterised by first signal quality criteria defined in terms of maximum allowable values of bit error rate (BER) and/or modulation error ratio (MER); and
   a control circuitry configured to adjust the bias current of said one or more amplifier units on the basis of the predetermined correlation.

2. The network element according to claim 1, wherein said predetermined correlation comprises at least a second network element-specific correlation equation between the detected output power of said active digital output channels and the corresponding minimum bias current, wherein the second correlation equation is defined using an output signal characterised by second lower signal quality criteria.

3. The network element according to claim 1, wherein said correlation curves are defined for output power in a range of at least 5-25 dBm.

4. The network element according to claim 1, wherein said detector configured to detect output power of all active digital output channels comprises a broadband RF detector.

5. The network element according to claim 1, wherein the digital output channels are modulated according to Single-Carrier Quadrature Amplitude Modulation (SC-QAM) or Orthogonal Frequency-Division Multiplexing (OFDM).

6. The network element according to claim 1, wherein said amplifier units comprise one or more of the following: a mid stage amplifier unit, a gain control amplifier unit, a slope control amplifier unit, an output hybrid amplifier unit.

7. The network element according to claim 1, wherein the bias current of said one or more amplifier units is configured to be adjusted on the basis of detected changes in the output power of said active digital output channels.

8. The network element according to claim 1, wherein the downstream signal transmission further comprises one or more analog signals to be amplified to one or more analog output channels.

* * * * *